(12) United States Patent
Hebiguchi

(10) Patent No.: US 6,295,046 B1
(45) Date of Patent: Sep. 25, 2001

(54) SHIFT REGISTER UNIT AND DISPLAY DEVICE

(75) Inventor: Hiroyuki Hebiguchi, Miyagi-ken (JP)

(73) Assignees: LG Philips LCD Co., Ltd., Seoul (KR); Alps Electric Co., Ltd., Tokyo (JP)

(*) Notice: Subject to any disclaimer, the term of this patent is extended or adjusted under 35 U.S.C. 154(b) by 0 days.

(21) Appl. No.: 09/143,872

(22) Filed: Aug. 31, 1998

(30) Foreign Application Priority Data

Sep. 3, 1997 (JP) ........................................... 9-238695

(51) Int. Cl.[7] ............................................. G09G 3/36
(52) U.S. Cl. .......................... 345/100; 345/99; 345/98; 345/92; 377/78; 377/79; 377/81; 377/67
(58) Field of Search ............................ 345/100, 98, 92, 345/99, 559; 377/76, 77, 78

(56) References Cited

U.S. PATENT DOCUMENTS

| | | | |
|---|---|---|---|
| 3,886,209 | * | 5/1975 | Weimer ................................. 345/100 |
| 5,410,583 | * | 4/1995 | Weisbrode et al. .................... 377/75 |
| 5,434,899 | | 7/1995 | Huq et al. . |
| 5,701,136 | * | 12/1997 | Huq et al. ............................ 345/100 |
| 5,859,630 | * | 1/1999 | Huq ..................................... 345/100 |
| 5,889,504 | * | 3/1999 | Kihara et al. ........................ 345/100 |
| 5,949,398 | * | 9/1999 | Kim ..................................... 345/100 |
| 6,052,426 | * | 1/1999 | Maurice .................................. 377/78 |

* cited by examiner

*Primary Examiner*—Richard Hjerpe
*Assistant Examiner*—Ali A. Zamani
(74) *Attorney, Agent, or Firm*—Brinks Hofer Gilson & Lione (57) ABSTRACT

A shift register unit has stages. In each stage, a clamping transistor and the control electrode of an output transistor are connected to the output electrode of an input transistor to which an output one stage behind is input. A pull-down resistor is connected to the output electrode of the output transistor. A capacitor is inserted between the control electrode and output electrode of the output transistor. A clock signal is input to the output transistor, and a signal obtained by inverting a clock signal two stages forward is input to the clamping transistor.

17 Claims, 8 Drawing Sheets

FIG. 8

SHIFT REGISTER UNIT AND DISPLAY DEVICE

BACKGROUND OF THE INVENTION

1. Field of the Invention

The present invention relates to a shift register unit provided in a display device like a liquid crystal display, which supplies a scanning signal, and a display device using the shift register unit.

2. Description of the Related Art

In an active-matrix liquid-crystal display device, a matrix of picture signal lines (source lines) and scanning signal lines (gate lines) is formed, and switching devices, such as thin film transistors (TFTs), for activating the liquid crystal of pixels are formed where both lines cross. A scanning signal that successively scans the signal lines so that all the switching devices on one scanning line are temporarily in conduction is supplied to the scanning signal lines, while a picture signal is supplied to the picture signal lines so as to be synchronized with the scanning.

Figure 5:
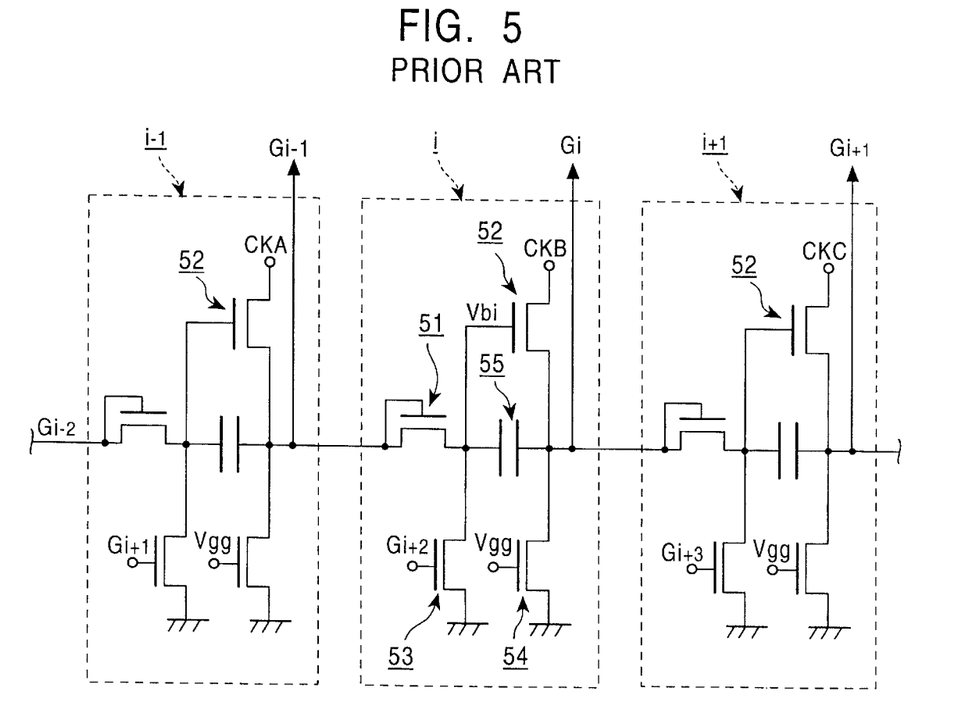
FIG. 5 is a circuit diagram showing three stages of a conventional shift register.
Figure 6:
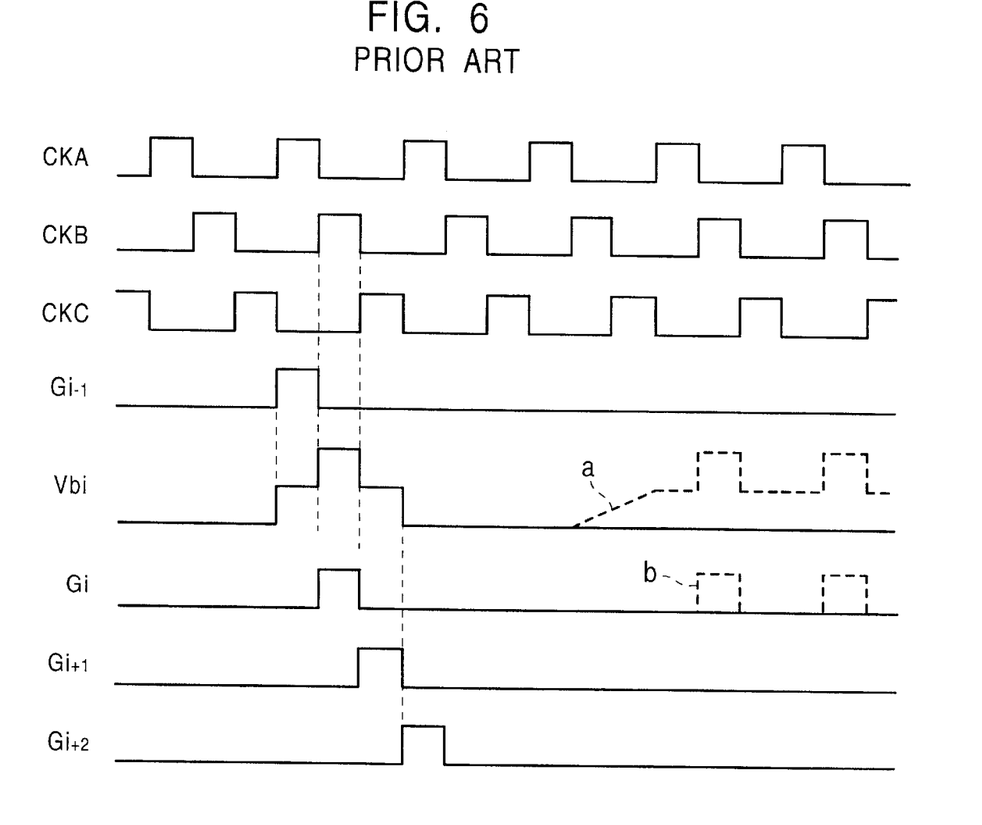
FIG. 6 is a timing chart of the conventional shift register shown in FIG. 5.

In this process, the function of successively supplying the scanning signal to the scanning signal lines is performed by a shift register. One example of a conventional shift register is illustrated in FIGS. 5 and 6. The shift register has a plurality of stages. FIG. 5 shows a circuit diagram of three stages. FIG. 6 shows a timing chart.

As shown in FIG. 5, the stages i−1, i and i+1 each have a combination of four transistors and one capacitor. This structure provides an advantage in that the transistor characteristics do not deteriorate since an excess stress is not exerted on the transistors. Referring to the stage i, a diode-connected input transistor 51 is connected to the output Gi−1 of the previous stage i−1, and a clamping transistor 53 and the control electrode of an output transistor 52 are connected to the output electrode of the input transistor 51. A pull-down transistor 54 is connected to the output electrode of the output transistor 52, and a capacitor 55 is inserted between the control electrode and output electrode of the output transistor 52.

In the above-described shift register, as shown in FIG. 5, a plurality of phase-shifted clock signals CKA, CKB and CKC are respectively input to the output transistors 52 of the stages i−1, i and i+1, and an output from two stages behind is input to the control electrode of the clamping transistor 53 in one stage. Accordingly, as shown in FIG. 6, in the stage i (dotted-line block in FIG. 5), when the previous stage output Gi−1 is at its "High" level, the input transistor 51 is switched "ON", whereby the control electrode potential Vbi (control signal) of the output transistor 52 rises, and in this condition the output transistor 52 is switched "ON". Thus, when the clock signal CKB is at its "High" level, the present stage output Gi is at its "High" level before being output. Subsequently, the output Gi+2 from two stages behind is at its "High" level, and when it is input to the control electrode of the clamping transistor 53, the clamping transistor 53 is switched "ON", whereby the control electrode potential Vbi of the output transistor 52 rises. In this manner, the outputs Gi−1, Gi and Gi+1 are successively output from the stages i−1, i and i+1. This can be used in, for example, a scanning circuit for a liquid crystal display device.

As can be seen in FIGS. 5 and 6, in the above-described shift register, a node, which is represented by Vbi in FIG. 5, is connected in a low impedance condition to a power supply only when the output Gi−1 input to the input transistor 51 or the output Gi+2 input to the clamping transistor 53 is at its "High" level. In other periods, all the transistors 51, 52 and 53 which cause the node Vbi to charge or discharge are in "OFF" (high impedance) condition, whereby the node Vbi is floating.

In the case where the above-described shift register is used for, e.g., gate scanning in a VGA display having 480 scanning lines, low impedance time is expressed as 2/480, and floating time is expressed as 478/480 (approximately 99.6%), which shows that the node Vbi is almost always in floating.

During the floating time, according to the essential function of the shift register, the node Vbi must maintain "Low" level potential so that the output Gi of the present stage i continues to be at its "Low" level. However, according to the above-described conventional shift register, since the node Vbi is floating, an excess of the control signal Vbi over the threshold value of the output transistor 52, caused by static and electromagnetic noise, causes a serious malfunction in which the present stage output Gi is at its "High" level when it essentially should be at its "Low" level. In addition, in the conventional structure, when the control signal voltage Vbi rises due to noise, this increased voltage condition (represented by the broken line a in FIG. 6) remains unchanged during the period in which the node Vbi is floating. Thus, output pulses (represented by the broken line b in FIG. 6) that must not be generated are continuously output at a clock cycle, which causes extremely adverse effects. Therefore, a problem occurs in that the use of the conventional shift register for gate scanning in a display rewrites a picture signal at timing at which the picture signal should not be rewritten, which is recognized as remarkably inferior display.

SUMMARY OF THE INVENTION

Accordingly, the present invention has been made in order to solve the foregoing problem, and an object thereof is to provide a shift register unit that does not malfunction even if being affected by static and electromagnetic noise, and a display device in which the shift register unit is employed to eliminate the possibility of producing an inferior display.

To this end, according to an aspect of the present invention, the foregoing object has been achieved through provision of a shift register unit composed of means for generating a plurality of clock signals having successively different phases, and a plurality of cascade-connected stages in which the stages generate output signals, with the number of the stages set to be more than the number of the clock signals, wherein the stages include: switching devices from which the output signals are output when output signals from the previous stages are input as control signals to the switching devices, and the clock signals corresponding to the plurality of clock signals are input to the switching devices while the control signals are being maintained; and clamping devices for suppressing in response to clock signals different in phase from the corresponding clock signals the control signals so that output signals from the switching devices are suppressed after the output signals from the switching devices are output.

Preferably, each switching device has a transistor device for generating an output signal by allowing the output signal from the previous stage to be input, and allowing the corresponding clock signal to be input, and a capacitor for holding as a control signal the voltage of the output signal from the previous stage.

The capacitor may be formed between the control electrode of the transistor device and the output electrode of the transistor device.

A pull-down device may be connected to the output electrode of the transistor device.

Each clamping device may include at least one diode device or diode-connected transistor device.

The shift register unit may have diode devices or diode-connected transistors for preventing electric charge to flow back from the present stages to the previous stages.

According to another aspect of the present invention, the foregoing object has been achieved through provision of a display device having a shift register unit as described above.

According to the present invention, a shift register unit includes clamping devices for suppressing control signals, whereby, if static and electromagnetic noise accumulates electric charge at the control electrode of each transistor device and the control signal level changes, the electric charge accumulated at the control electrode flows away so that each control signal is suppressed whenever a clock signal having a phase different from that of a clock signal input to each transistor device is input to each clamping device. In other words, the clamping device of the present stage operates so that the control signal of each transistor device is periodically refreshed to its "Low" level. This prevents a malfunction in which, similarly to the conventional shift register, an excess of the control electrode potential of each output transistor over its threshold value, caused by static and electromagnetic noise, causes the output transistor to output the "Low" level when the output transistor should output the "High" level.

According to the present invention, a display device is free from malfunctioning in which output pulses that essentially should not be generated are output from a shift register unit used to scan a display. Therefore, this prevents inferior display in which a picture signal is rewritten at timing at which it essentially should not be rewritten.

DESCRIPTION OF THE PREFERRED EMBODIMENTS

One embodiment of the present invention will be described with reference to FIGS. 1 to 4.

Figure 1:
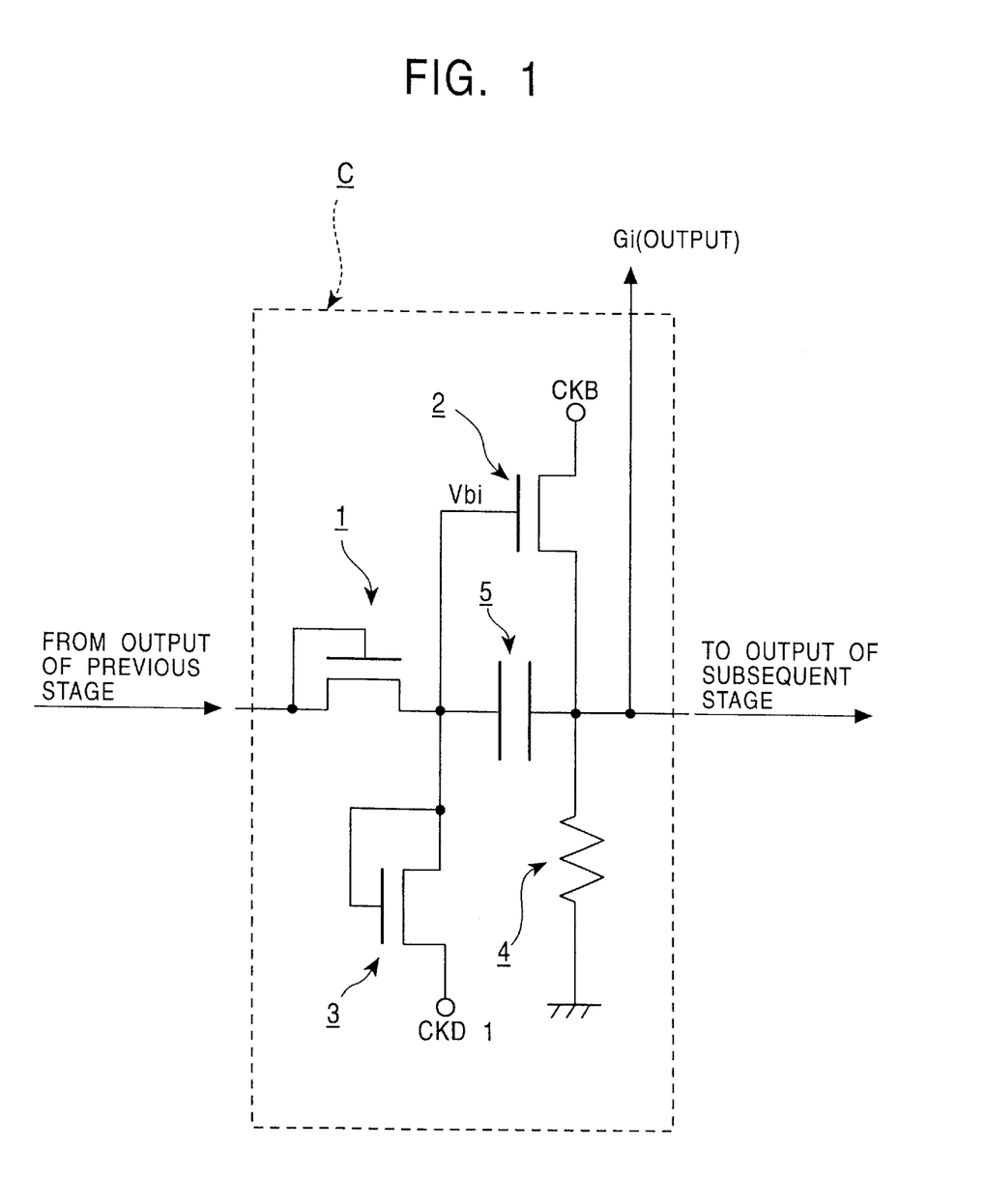
FIG. 1 is a circuit diagram showing one stage of a shift register according to one embodiment of the present invention.
Figure 2:
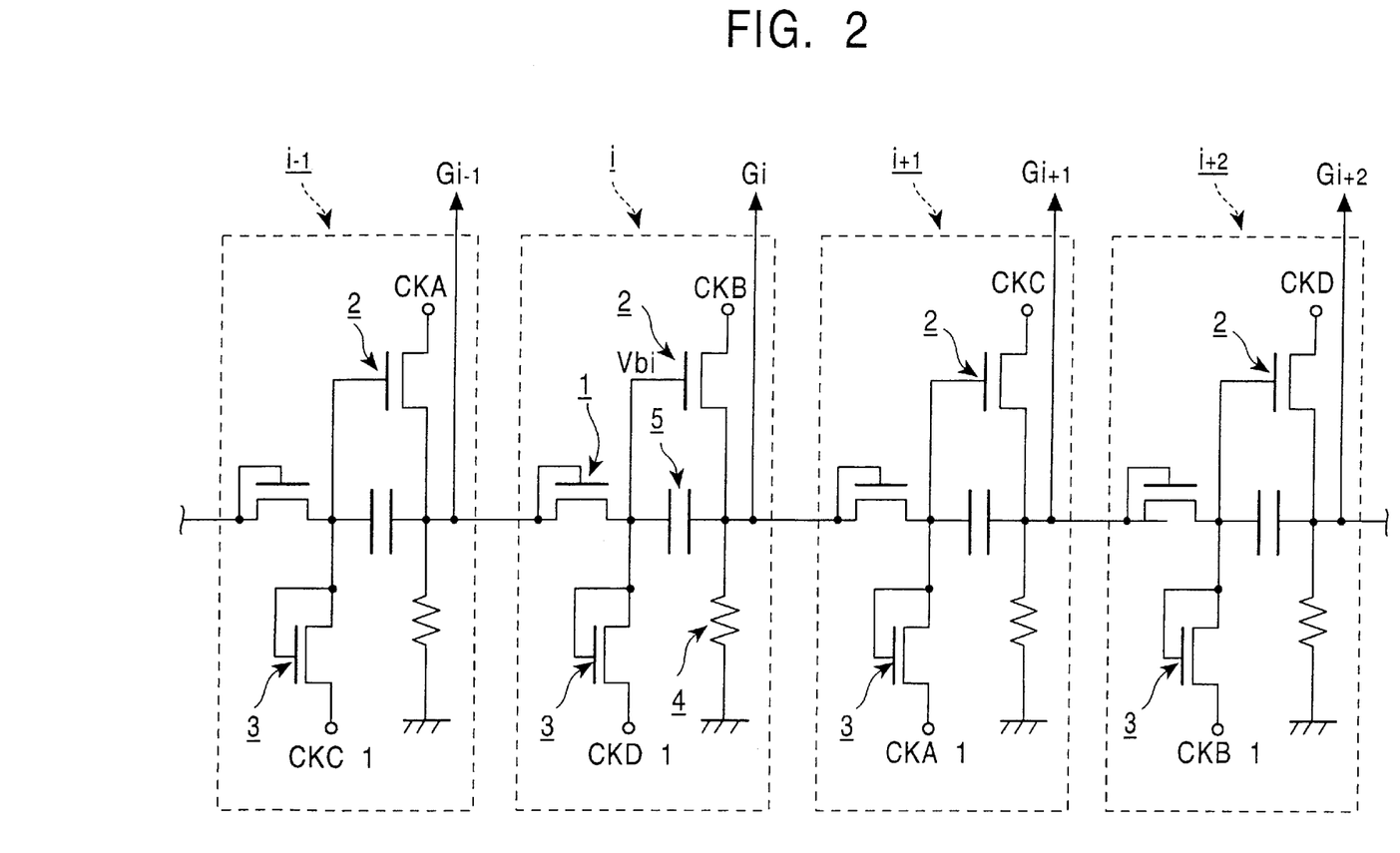
FIG. 2 is a circuit diagram showing four stages of the shift register shown in FIG. 1.
Figure 3:
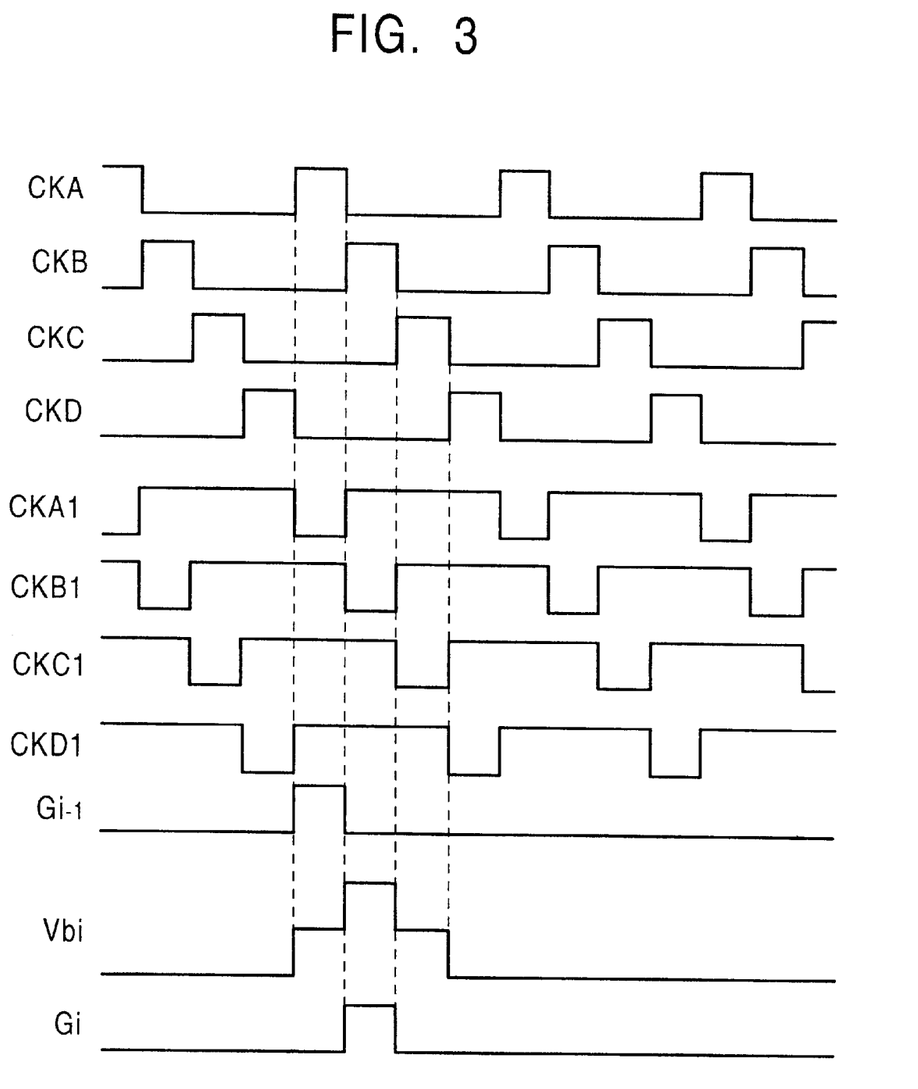
FIG. 3 is a timing chart for the shift register shown in FIG. 1.

FIGS. 1 to 3 illustrate a shift register according to the embodiment. This shift register consists of a means for generating a plurality of clock signals having successively different phases, and a plurality of cascade-connected stages.

FIG. 1 is a circuit diagram of one stage (dotted-line block C) of the shift register, and FIG. 2 is a circuit diagram of four cascade-connected stages of the shift register. FIG. 3 is a timing chart for the shift register.

As shown in FIG. 1, each stage has a combination of three transistors, one capacitor, and one resistor. A diode-connected input transistor 1 is connected to the output of the previous stage, and a clamping transistor 3 and the control electrode of an output transistor 2 consisting of a diode-connected transistor are connected to the output electrode of the input transistor 1. The input transistor 1 is used to prevent electric charge from flowing back from the present stage to the previous stage.

A pull-down resistor 4 is connected to the output electrode of the output transistor 2, and a capacitor 5 is inserted between the control electrode and output electrode of the output transistor 2. The capacitor 5 is a capacitance for maintaining the voltage of a control signal of the output transistor 2, and functions as a bootstrap capacitor. In this embodiment, a diode-connected transistor is used as the clamping device. Instead, a diode itself may be used.

In this embodiment, an example of a shift register driven by four-phase clocks is described. As shown in FIGS. 2 and 3, four-phase clock signals CKA, CKB, CKC and CKD having successively shifted phases are respectively input to the output transistors 2 of the stages i−1, i, i+1 and i+2, and signals CKA1, CKB1, CKC1 and CKD1, obtained by inverting clock signals input two stages forward, are input to the clamping transistors 3 of the stages. For example, referring to the stage i (dotted-line block in FIG. 2), the clock signal CKB is input to the output transistor 2, and the signal CKD1 obtained by inverting the clock signal CKD input two stages forward is input to the clamping transistor 3.

Accordingly, in the stage i in FIG. 2, as shown in FIG. 3, the input transistor 1 is switched "ON" (forward direction) when the previous output Gi−1 is at its "High" level, whereby the potential Vbi (control signal) of the control electrode of the output transistor 2 rises, and in this condition the output transistor 2 is switched "ON". Thus, when the clock signal CKB is at its "High" level, the output Gi is at its "High" level before being output. Because the control electrode of the output transistor 2 is connected to the output Gi by the capacitor 5, and the capacitor 5 functions as a bootstrap capacitor, the waveform of the control signal (Vbi) is convex, synchronizing with the rise of the output Gi. Subsequently, when the inverted signal CKD1 input to the clamping transistor 3 is at its "Low" level, the clamping transistor 3 is switched "ON" (forward direction). Thus, the control signal Vbi of the output transistor 2 falls, and the condition of the control signal Vbi holds unchanged until the previous stage output is at its "High" level. In the same manner, outputs Gi−1, Gi, Gi+1 and Gi+2 from the stages i−1, i, i+1 and i+2 are successively output.

According to the conventional shift register, a problem occurs in which, since the control electrode of an output transistor is almost always floating, an excess of the control signal Vbi over the threshold value of the output transistor, caused by static and electromagnetic noise, causes an output Gi to be successively output at it "High" level when the output Gi should be output at its "Low" level.

Conversely, according to the shift register of the present invention, because an inverted signal based on a clock signal two stages forward is input to the clamping transistor 3, the clamping transistor 3 is switched "ON" whenever the inverted signal is at its "Low" level, whereby the control signal Vbi of the output transistor 2 is refreshed. In other words, the control signal Vbi of the output transistor 2 is refreshed at a clock cycle.

In this structure, in the case where the static and electromagnetic noise accumulates electric charge at the control electrode of the output transistor 2, the electric charge flows away through the clamping transistor 3 at the clock cycle. In the case where the noise increases the control signal Vbi, no adverse effects are generated by refreshing the control signal Vbi before it reaches the threshold value because the control signal Vbi is periodically refreshed to its "Low" level. If the control signal Vbi exceeds the threshold value, the shift register does not malfunction at a cycle over the clock cycle. In any case, according to the shift register of the present invention, adverse effects due to noise-caused malfunction can be remarkably reduced compared with the conventional shift register.

In order that the control signal Vbi of the output transistor 2 may be securely refreshed, it is preferable to decrease the "Low" level of the inverted signal CKD1 based on the clock signal two stages forward so as to be smaller by the amount of the transistor threshold value. In this case, the level of the inverted signal CKD1 may be only shifted in parallel in the negative direction.

In this embodiment, the inverted signal based on the clock signal input to the output transistor 2 is used as a means for periodically switching "ON" the clamping transistor 3. Thus, a sharp output-signal waveform that reflects a sharp on/off waveform from a clock-signal generating power supply can be obtained. In addition, by simply providing a circuit for inverting the clock signal, it is not required to provide a circuit that generates an independent clock signal for activating the clamping transistor 3, which simplifies the circuit structure.

In this embodiment, the capacitor 5 is inserted between the control electrode and output electrode of the output transistor 2, and the capacitor 5 functions as a bootstrap capacitance. Thus, the driving of the output transistor 2 is improved, whereby a pulse of the output Gi is more securely output in response to a pulse of the clock signal CKB input to the present stage i. In order to securely obtain bootstrap effects, it is preferable that the waveform of the inverted signal CKD1 based on the clock signal two stages forward is shaped convex similarly to that of the control signal Vbi.

Figure 7:
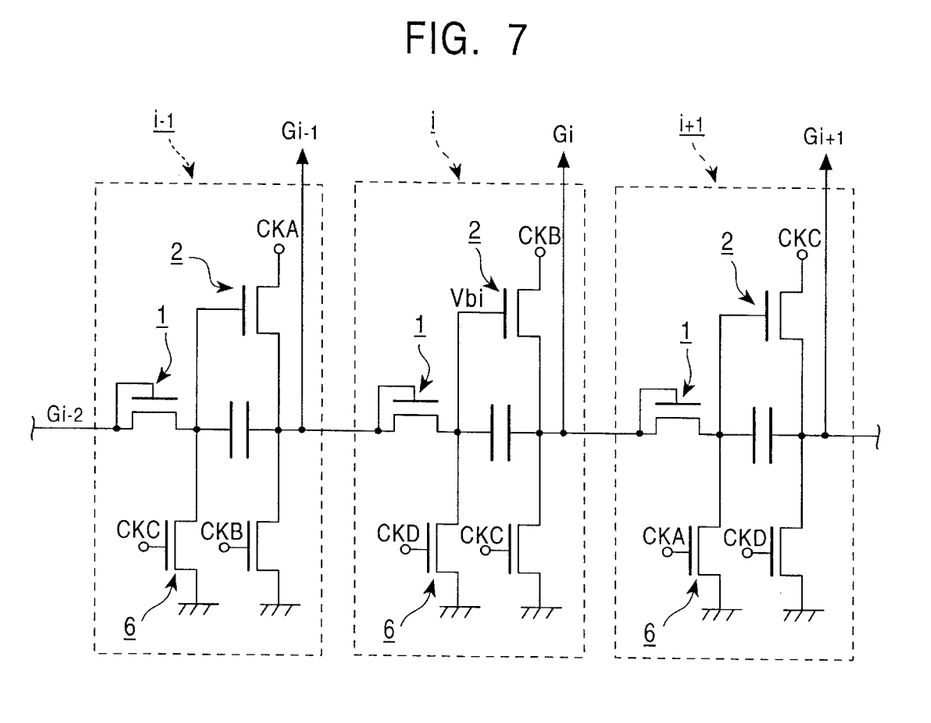
FIG. 7 is a circuit diagram showing three stages of a shift register having noise resistance increased by refreshing a control signal with clocks.
Figure 8:
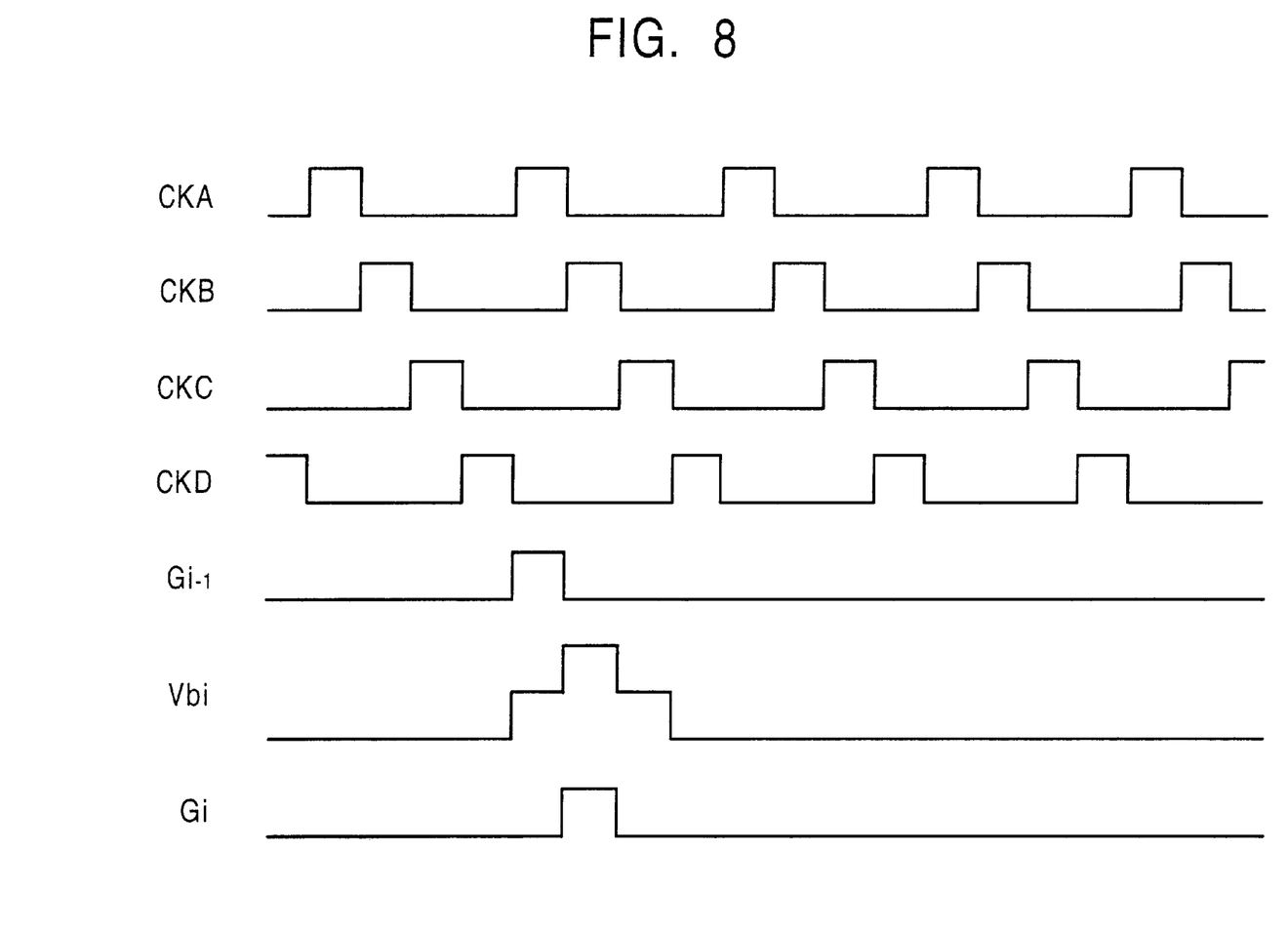
FIG. 8 is a timing chart for the shift register shown in FIG. 7.

In addition, concerning a technique for refreshing a control signal with clocks, there is a technique in which, as shown in FIG. 7, a clamping device 6 consists of a non-diode-connected transistor. Referring to noise resistance, also this technique provides an advantage similar to the above-described embodiment as shown in FIG. 8. However, this technique is inferior in that the necessity of connecting a clock line to the control electrode of the clamping transistor 6 increases a load capacitance for requiring a clock generating power supply having large power-supply capability, which increases power consumption, and an increased wiring thickness for reducing wiring resistance enlarges an area occupied by the circuit.

Conversely, according to the above-described embodiment, because a clock line is not connected to the control electrode of the clamping transistor 3, the load capacitance is reduced to achieve the elimination of the foregoing problem and the improvement of resistance to noise.

Figure 4:
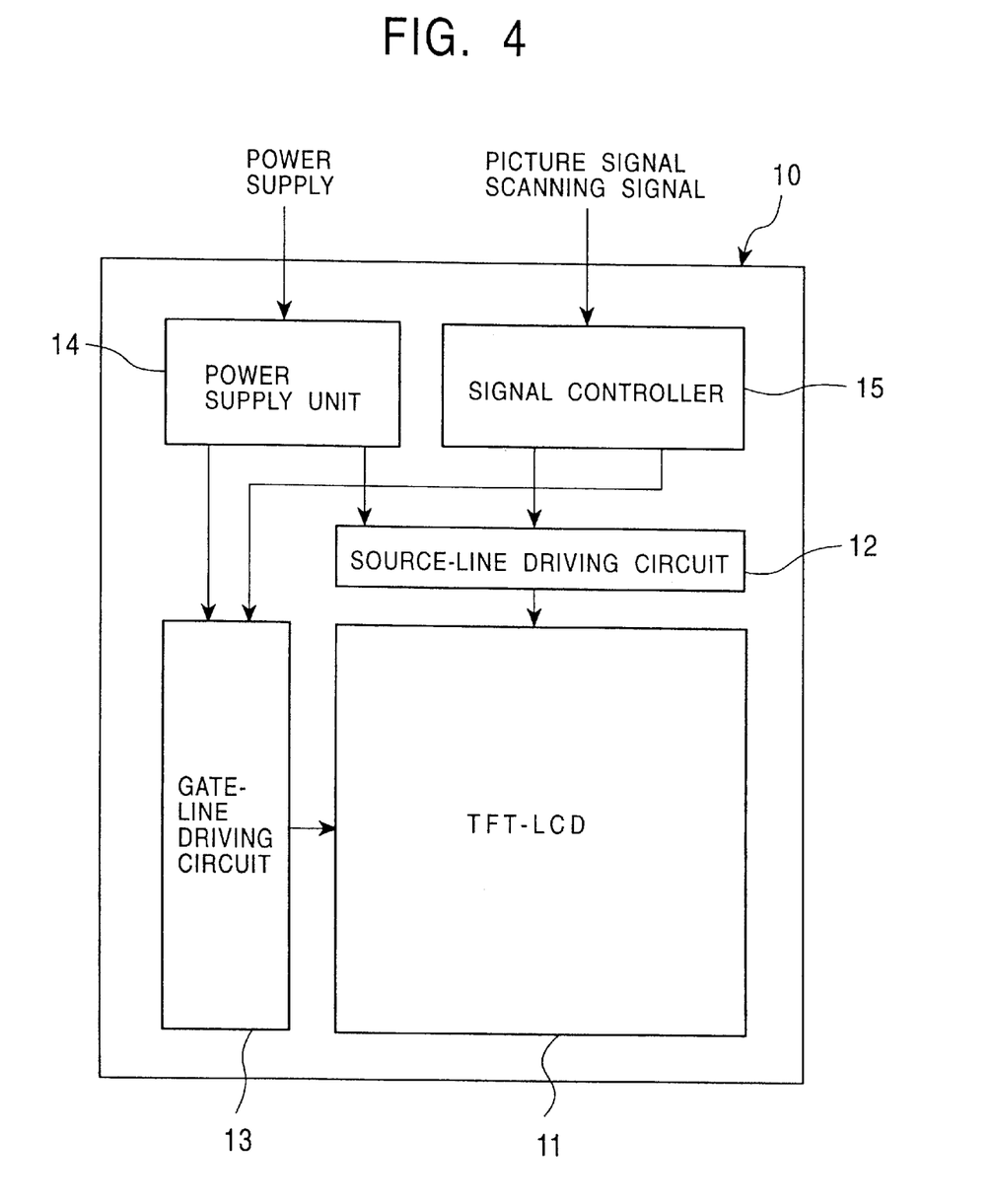
FIG. 4 is a block diagram showing a liquid-crystal display device including the shift register shown in FIG. 1.

FIG. 4 shows a circuit diagram of a liquid-crystal rim display device provided with a shift register according to the above-described embodiment. As shown in FIG. 4, a liquid-crystal display device 10 has a matrix of picture signal lines (source lines) and scanning signal lines (gate lines), a thin-film-transistor liquid-crystal display unit (TFT-LCD) 11 in which TFTs for driving the liquid crystal of pixels are formed where both lines cross, a source-line driving circuit 12 for driving the source lines, a gate-line driving circuit 13 for driving the gate lines, a power supply unit 14 for supplying power-supply voltages to the gate-line and source-line driving circuits 12 and 13, and a signal controller 15.

In the liquid-crystal display device 10, shift registers are used in both the gate-line and source-line driving circuits 12 and 13. Concerning gate scanning by the shift register in the gate-line driving circuit 13, gate-line driving transistors are connected to the gate lines, and the gate-line driving transistors are driven by the shift register in the gate-line driving circuit 13 so that each transistor is successively in conduction from the top row to the bottom row during a scanning period. As a result, when the gate-line driving transistors, which are connected to one arbitrary gate line, are in conduction synchronizing with a horizontal scanning signal, all the TFTs which are connected to the one gate line are in conduction. In this manner, electric charge as each source-line picture signal is accumulated in the capacitor of each pixel electrode.

The liquid-crystal display device 10 according to the embodiment includes shift registers having superior resistance to noise as described above, whereby eliminating an inferior display caused by the rewriting of the picture signal at timing at which it should not be rewritten, and having high reliability.

The technical scope of the present invention is not limited to the foregoing embodiments, and may be variously modified within the subject matter thereof. For example, in the foregoing embodiments, for obtaining a sharp output signal waveform and simplifying a circuit structure, a signal obtained by inverting a clock signal is used as a signal for periodically driving the clamping transistor 3. However, if it is not necessary to obtain an advantage in that a sharp output signal waveform is generated to simplify the circuit arrangement, a separate circuit for generating a signal having the "Low" level, which periodically drives the clamping transistor 3, may be provided.

In the foregoing embodiments there have been described the case where four-phase clock signals CKA, CKB, CKC and CKD are used. However, the number of clock signals for use is not limited to four.

In the case where clock signals having four phases or more are used, and the clamping transistor 3 as in the foregoing embodiments is used, as an inverted signal that is input to the clamping transistor 3, a signal obtained by inverting any one clock signal from among a clock signal two stages forward to a clock signal one stage behind may be used.

A device other than a resistor may be used as a pull-down device. This pull-down device may be provided outside the basic structure without being provided as a basic component in each stage.

What is claimed is:
1. A shift register unit comprising:
means for generating a plurality of clock signals having successively different phases; and
a plurality of cascade-connected stages in which said stages generate output signals, said stages including:
switching devices from which the output signals are output when output signals from the previous stages are input as control signals to said switching devices, and said plurality of clock signals are input to said switching devices while said control signals are being maintained; and clamping devices for suppressing said control signals in response to clock signals input to said clamping devices that are different in phase from the corresponding clock signals input to said switching devices so that output signals from said switching devices are maintained error-free, wherein each of said switching devices includes an output transistor device for generating an output signal by taking the output signal from the previous stage and the corresponding clock signal to be inputs, each of said clamping devices has one end connected to a control electrode of said output transistor device and receives at the other end a clock signal different in phase from the corresponding clock signal input to said output transistor device, and said clock signal input to said clamping device of said each of said switching devices is an inverted form of a clock signal input to a switching device two stages away from each of said switching devices.

2. The shift register unit according to claim 1, wherein said each switching device includes a capacitor for holding as a control signal the voltage of the output signal from the previous stage, said capacitor is formed between the control electrode of said output transistor device and the output electrode of said output transistor device.

3. The shift register unit according to claim 1, wherein each clamping device includes at least one diode device.

4. The shift register unit according to claim 1, wherein said each switching device includes at least one diode device for preventing electric charge to flow back from the present stage to the previous stage, said diode device has one end connected to the control electrode of said output transistor.

5. The shift register unit according to claim 1, wherein each clamping device includes at least one diode-connected transistor device.

6. The shift register unit according to claim 1, wherein said each switching device includes at least one diode-connected transistor for preventing electric charge to flow back from the present stage, said diode-connected transistor device has one end connected to the control electrode of said output transistor.

7. A display device comprising a shift register unit, said shift register unit comprising:

means for generating a plurality of clock signals having successively different phases; and a plurality of cascade-connected stages in which said stages generate output signals, said stages including:

switching devices from which the output signals are output when output signals from the previous stages are input as control signals to said switching devices, and said plurality of clock signals are input to said switching devices while said control signals are being maintained; and clamping devices for suppressing said control signals in response to clock signals input to said clamping devices that are different in phase from the corresponding clock signals input to said switching devices so that output signals from said switching devices are maintained error-free, wherein each of said switching devices includes an output transistor device for generating an output signal by taking the output signal from the previous stage and the corresponding clock signal to be inputs, each of said clamping devices has one end connected to a control electrode of said output transistor device and receives at the other end a clock signal different in phase from the corresponding clock signal input to said output transistor device, and said clock signal input to said clamping device of said each of said switching devices is an inverted form of said clock signal input to a switching device two stages away from said each switching device.

8. A shift register unit comprising:

means for generating a plurality of clock signals having successively different phases; and a plurality of cascade-connected stages in which said stages generate output signals, said stages including:

switching devices from which the output signals are output when output signals from the previous stages are input as control signals to said switching devices, and said plurality of clock signals are input to said switching devices while said control signals are being maintained; and clamping devices for suppressing said control signals in response to clock signals input to said clamping devices that are different in phase from the corresponding clock signals input to said switching devices so that output signals from said switching devices are maintained error-free, wherein each of said switching devices includes an output transistor device for generating an output signal by taking the output signal from the previous stage and the corresponding clock signal to be inputs, and each of said clamping devices has one end connected to a control electrode of said output transistor device, and has at least one diode device at the other end of said clamping device so as to receive a clock signal different in phase from the corresponding clock signal input to said output transistor device.

9. The shift register unit according to claim 8, wherein said clock signal input to the other end of said diode device is an inverted form of a clock signal different in phase from the corresponding clock signal input to said output transistor device.

10. The shift register unit according to claim 8, wherein said clock signal input to the other end of said diode device is an inverted form of a clock signal input to a switching device two stages away from each of said switching devices.

11. A display device comprising the shift register unit set forth in claim 8.

12. A shift register unit comprising:

means for generating a plurality of clock signals having successively different phases; and a plurality of cascade-connected stages in which said stages generate output signals, said stages including:

switching devices from which the output signals are output when output signals from the previous stages are input as control signals to said switching devices, and said plurality of clock signals are input to said switching devices while said control signals are being maintained; and clamping devices for suppressing said control signals in response to clock signals input to said clamping devices that are different in phase from the corresponding clock signals input to said switching devices so that output signals from said switching devices are maintained error-free, wherein each of said switching devices includes an output transistor device for generating an output signal by taking the output signal from the previous stage and the corresponding clock signal to be inputs, and each of said clamping devices has one end connected to a control electrode of said output transistor device, and has at least one diode-connected transistor device at the other end so as to receive a clock signal different in phase from the corresponding clock signal input to said output transistor device.

13. The shift register unit according to claim 12, wherein said clock signal input to the other end of said diode-connected transistor device is an inverted form of a clock signal different in phase from the corresponding clock signal input to said output transistor device.

14. The shift register unit according to claim 12, wherein said clock signal input to the other end of said diode-connected transistor device is an inverted form of a clock signal input to a switching device two stages away from each of said switching devices.

15. A display device comprising the shift register unit set forth in claim 12.

16. A shift register unit comprising:

means for generating a plurality of clock signals having successively different phases; and a plurality of cascade-connected stages in which said stages generate output signals, said stages including:

switching devices from which the output signals are output when output signals from the previous stages are input as control signals to said switching devices, and said plurality of clock signals are input to said switching devices while said control signals are being maintained; and clamping devices for suppressing said control signals in response to clock signals input to said clamping devices that are different in phase from the corresponding clock signals input to said switching devices so that output signals from said switching devices are maintained error-free, wherein each of said switching devices includes an output transistor device for generating an output signal by taking the output signal from the previous stage and the corresponding clock signal to be inputs, and said clock signal input to said clamping device is an inverted form of a clock signal different in phase from the corresponding clock signal input to said output transistor device.

17. A display device comprising the shift register unit set forth in claim 16.

* * * * *